(12) United States Patent
Park et al.

(10) Patent No.: US 11,862,537 B2
(45) Date of Patent: Jan. 2, 2024

(54) SOLDERING STRUCTURE WITH GROOVE PORTION AND POWER MODULE COMPRISING THE SAME

(71) Applicants: Hyundai Motor Company, Seoul (KR); Kia Corporation, Seoul (KR)

(72) Inventors: Jun Hee Park, Hwaseong-si (KR); Nam Sik Kong, Hwaseong-si (KR); Hyun Koo Lee, Seoul (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 275 days.

(21) Appl. No.: 17/374,553

(22) Filed: Jul. 13, 2021

(65) Prior Publication Data

US 2022/0044988 A1 Feb. 10, 2022

(30) Foreign Application Priority Data

Aug. 5, 2020 (KR) .................. 10-2020-0098153

(51) Int. Cl.
*H01L 23/492* (2006.01)
*H01L 23/00* (2006.01)
*H05K 3/10* (2006.01)
*H05K 3/34* (2006.01)

(52) U.S. Cl.
CPC .......... *H01L 23/4924* (2013.01); *H01L 24/32* (2013.01); *H01L 24/73* (2013.01); *H05K 3/107* (2013.01); *H05K 3/3468* (2013.01); *H01L 2224/2612* (2013.01); *H01L 2224/32245* (2013.01); *H01L 2224/73251* (2013.01)

(58) Field of Classification Search
CPC .................................................... H01L 23/4924
USPC ........................................... 257/772; 438/612
See application file for complete search history.

(56) References Cited

U.S. PATENT DOCUMENTS

2008/0258316 A1* 10/2008 Tamba .................... H01L 24/32
257/E23.079
2018/0174945 A1* 6/2018 Park .................... H01L 23/3677

FOREIGN PATENT DOCUMENTS

| CN | 206388700 U | * | 8/2017 |
|---|---|---|---|
| KR | 10-2017-0069363 A | | 6/2017 |
| KR | 10-2017-0092750 A | | 8/2017 |
| KR | 10-2018-0052143 A | | 5/2018 |

* cited by examiner

*Primary Examiner* — Ajay Arora
(74) *Attorney, Agent, or Firm* — MORGAN, LEWIS & BOCKIUS LLP (57) ABSTRACT

A soldering structure configured for preventing solder overflow during soldering and a power module, may include a component to be soldered; and a metal layer having a bonding area, to which the component to be soldered is bonded by solder, and a groove portion formed around the bonding area.

19 Claims, 8 Drawing Sheets

SOLDERING STRUCTURE WITH GROOVE PORTION AND POWER MODULE COMPRISING THE SAME

CROSS REFERENCE TO RELATED APPLICATION

The present application claims priority to Korean Patent Application No. 10-2020-0098153, filed on Aug. 5, 2020, the entire contents of which is incorporated herein for all purposes by this reference.

BACKGROUND OF THE INVENTION

Field of the Invention

The present invention relates to a soldering structure and a power module including the same, and more particularly, to a soldering structure configured for preventing solder overflow during soldering, and a power module including the same.

Description of Related Art

In general, a power module used for power conversion to drive an electric motor that generates motive power of a vehicle may have a power semiconductor chip having a structure in which a power semiconductor chip, substrates respectively disposed on the upper and lower portions of the power semiconductor chip and various other components are bonded and electrically connected to one another. A power semiconductor device may perform high-speed switching for converting high power and may thus generate a lot of heat. To easily radiate such heat and thus prevent performance deterioration of the power semiconductor device, there has been developed a double-sided cooling type power module in which a cooling channel may each be attached to the upper and lower portions of the power module. The double-sided cooling type power module has a structure in which the substrates are respectively disposed on the upper and lower portions of the power module and may thus be in contact with the upper and lower cooling channels, respectively.

In the case of such a double-sided cooling type power module, it is important to manufacture the power module to have a constant height. The reason is that: the cooling channel in contact with each of the upper and lower substrates of the power module by having a thermal interface material (TIM) interposed therebetween needs to be in even contact with each of the substrates of the power module; and when manufacturing the power module, there is a risk in which the substrate or other components electrically connected thereto may be damaged when a certain amount of molding material is injected thereto in a molding process, and the molding material may penetrate into a portion having a lower height, reducing cooling performance of the power module.

A height of the power module has been conventionally controlled by a soldering process that physically/electrically bonds the components in the power module to each other. In more detail, the following method has been conventionally used: a large amount of solder is provided when soldering the components disposed on the substrate and the substrate to each other and the components to each other; and the provided large amount of solder thus raises the height of the power module when the height is low, or overflows around to lower the height of the power module when the height is high.

However, such a conventional method to control the height of the power module may cause the following problem: in a case where the provided solder is overflowing, the solder may penetrate to a boundary of a pattern formed on a metal layer of the substrate and stress caused by the solder may be added to the substrate, and due to the added stress, an insulating layer (ceramic layer) included in the substrate may be broken when receiving thermal shock.

The information included in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a soldering structure, configured for solving a problem such as damage to the power module caused by solder overflow by minimizing the solder overflow even though a large amount of solder is provided to control a height of the power module, and a power module including the same.

According to various exemplary embodiments of the present invention, a soldering structure includes: a component to be soldered; and a metal layer having a bonding area, to which the component to be soldered is bonded by solder, and a groove portion formed around the bonding area.

In the soldering structure according to various exemplary embodiments of the present invention, the groove portion may have a plurality of dimples surrounding the bonding area.

In the soldering structure according to various exemplary embodiments of the present invention, a space between each of the plurality of dimples may be smaller than a diameter of each of the plurality of dimples. The space between each of the plurality of dimples may more preferably be smaller than or equal to half the diameter of each of the plurality of dimples.

In the soldering structure according to various exemplary embodiments of the present invention, the component to be soldered may be made of a metal material having excellent solder wettability such as copper (Cu), silver (Ag), gold (Au) or nickel (Ni).

In the soldering structure according to various exemplary embodiments of the present invention, the component to be soldered may have a surface plated with a metal material having excellent solder wettability such as copper (Cu), silver (Ag), gold (Au) or nickel (Ni).

In the soldering structure according to various exemplary embodiments of the present invention, the component to be soldered may have one surface facing the bonding area and a side surface perpendicular to the one surface, and the solder may extend to the side surface of the component to be soldered.

According to various exemplary embodiments of the present invention, a power module includes: a component to be soldered; and a substrate including a first metal layer, a dielectric layer and a second metal layer, the first metal layer having an upper surface having a bonding area, to which the component to be soldered is bonded by solder, and a groove portion formed around the bonding area, the dielectric layer being bonded to a lower surface of the first metal layer and the second metal layer being bonded to a lower surface of the dielectric layer.

In the power module according to various exemplary embodiments of the present invention, the groove portion may have a plurality of dimples surrounding the bonding area.

In the power module according to various exemplary embodiments of the present invention, the space between each of the plurality of dimples may be smaller than or equal to half the diameter of each of the plurality of dimples. The space between each of the plurality of dimples may more preferably be smaller than or equal to half the diameter of each of the plurality of dimples.

In the power module according to various exemplary embodiments of the present invention, the component to be soldered may be a spacer electrically connecting the first metal layer and another component to each other.

The power module according to various exemplary embodiments of the present invention may further include a second substrate including a third metal layer, a dielectric layer and a fourth metal layer, the third metal layer having an upper surface having a bonding area, to which the component to be soldered is bonded by solder, and a groove portion formed around the bonding area, the dielectric layer being bonded to a lower surface of the third metal layer and the fourth metal layer being bonded to a lower surface of the dielectric layer, wherein the component to be soldered may be a spacer electrically connecting the first metal layer and the third metal layer to each other.

In the power module according to various exemplary embodiments of the present invention, the spacer may be made of a metal material having excellent solder wettability such as copper (Cu), silver (Ag), gold (Au) or nickel (Ni).

In the power module according to various exemplary embodiments of the present invention, the spacer may have a surface plated with a metal material having excellent solder wettability such as copper (Cu), silver (Ag), gold (Au) or nickel (Ni).

In the power module according to various exemplary embodiments of the present invention, the spacer may have one surface facing the bonding area and a side surface perpendicular to the one surface, and the solder may extend to the side surface of the spacer.

In the power module according to various exemplary embodiments of the present invention, a depth of a groove portion may be smaller than a thickness of the first metal layer, and a depth of a groove portion may be smaller than a thickness of the third metal layer.

The methods and apparatuses of the present invention have other features and advantages which will be apparent from or are set forth in more detail in the accompanying drawings, which are incorporated herein, and the following Detailed Description, which together serve to explain certain principles of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent portions of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Hereinafter, a soldering structure and a power module according to various embodiments of the present invention are described in detail with reference to the accompanying drawings.

Figure 1:
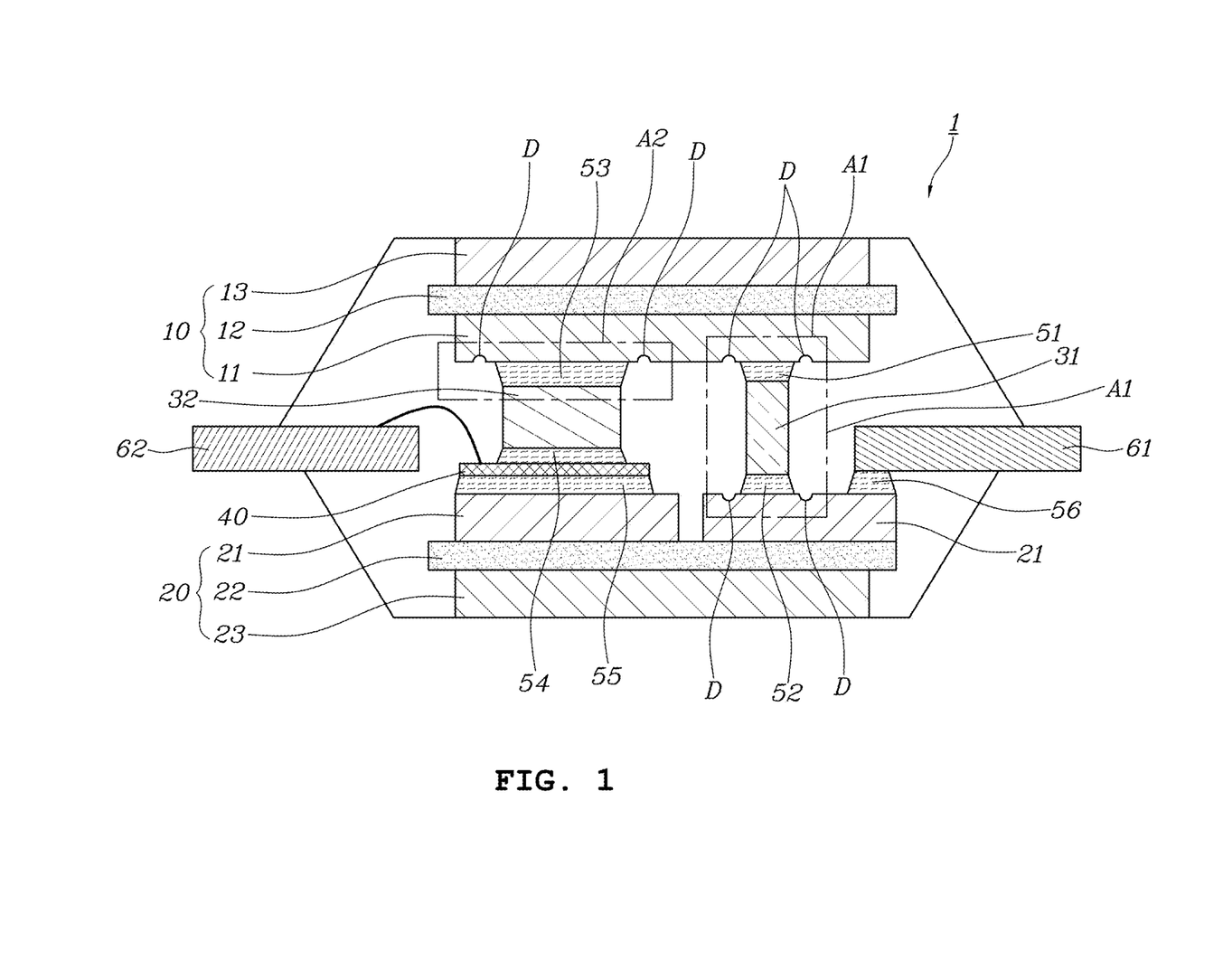
FIG. 1 is a cross-sectional view showing a power module using a soldering structure according to various exemplary embodiments of the present invention.

FIG. 1 is a cross-sectional view showing a power module using a soldering structure according to various exemplary embodiments of the present invention.

As shown in FIG. 1, a power module 1 may be a double-sided cooling type power module having substrates 10 and 20 on its upper and lower portions.

The upper substrate 10 may include a first metal layer 11, a dielectric layer 12 bonded to an upper surface of the first metal layer 11, and a second metal layer 13 bonded to an upper surface of the dielectric layer 12. Although not shown, a cooling channel may be disposed on the upper surface of the second metal layer 13 by having a thermal interface material (TIM) interposed therebetween.

Like the upper substrate 10, the lower substrate 20 may include a first metal layer 21, a dielectric layer 22 bonded to a lower surface of the first metal layer 21 and a second metal layer 23 bonded to a lower surface of the dielectric layer 22. Although not shown, the other cooling channel may be disposed on the lower surface of the second metal layer 23 by having a thermal interface material (TIM) interposed therebetween.

The dielectric layers 12 and 22 respectively included in the upper substrate 10 and the lower substrate 20 may each have a large thickness tolerance due to characteristics of its manufacturing process. Therefore, for the entire power module 1 to have a constant height by compensating for each thickness tolerance of the dielectric layers 12 and 22 respectively included in the upper substrate 10 and the lower substrate 20, the height depending on melting of solders 51 to 53 may be adjusted by increasing each amount of the solders 51 to 53 that physically/electrically bond components in the power module 1 to each other.

For example, a large amount of solder may be used to compensate for the height of the power module 1 having a value lower than a set value, and in a case where the height has a value higher than the set value and thus needs to be lowered, the height may be lowered by widely spreading the molten solders 51 to 53.

The solders 51 to 53 for adjusting the height may be used to directly or indirectly bond components to each other between the upper and lower substrates. The solder for adjusting the height is used for a component, which is bonded to each of the metal layers 11 and 21 of the substrates 10 and 20 by solder and not affecting the operation or durability of the power module.

For example, as shown in FIG. 1, the solders 51 to 53 may be suitable for adjusting the height as the solders used for respectively bonding spacers 31 and 32 and the metal layers 11 and 21 of the substrates 10 and 20 to each other. Solders 54 and 55 may be used to bond a power semiconductor chip 40 to another component, may affect an operation of the power semiconductor chip 40 due to solder overflow, and thus may not be suitable for adjusting the height. Furthermore, a solder 56 may bond a lead 61 to the metal layer 21 of the substrate 20, may not be directly or indirectly connected to the upper substrate 10, and thus may not be suitable for adjusting the height.

The soldering structure according to various exemplary embodiments of the present invention may be used for portions respectively marked by reference numerals 'A1' and 'A2' shown in FIG. 1. The soldering structure may include: the component 31 or 32 to be soldered; and the metal layer 11 or 21 having a bonding area, to which the component 31 or 32 to be soldered is bonded by solder, and a groove portion D formed around the bonding area.

In the power module 1 using the soldering structure according to various exemplary embodiments of the present invention, the components to be soldered may be the spacers 31 and 32, and the metal layers may be the metal layers 11 and 21 included in the substrates 10 and 20, respectively.

An upper end portion of the via spacer 31 may be bonded to the first metal layer 11 of the upper substrate 10 by the solder 51, and a lower end portion of the via spacer 31 may be bonded to the first metal layer 21 of the lower substrate 20 by the solder 52, without having any component interposed therebetween, and the groove portion D may be formed on each of the metal layers 11 and 21 respectively bonded to both the end portions of the via spacer 31.

One end portion of the spacer 32 may be bonded to the power semiconductor chip 40 by the solder 54 and the other end portion of the spacer 32 may be bonded to the first metal layer 11 of the first substrate 10 by the solder 53, and the groove portion D may be formed only on the first metal layer 11 of the first substrate 10.

Figure 2:
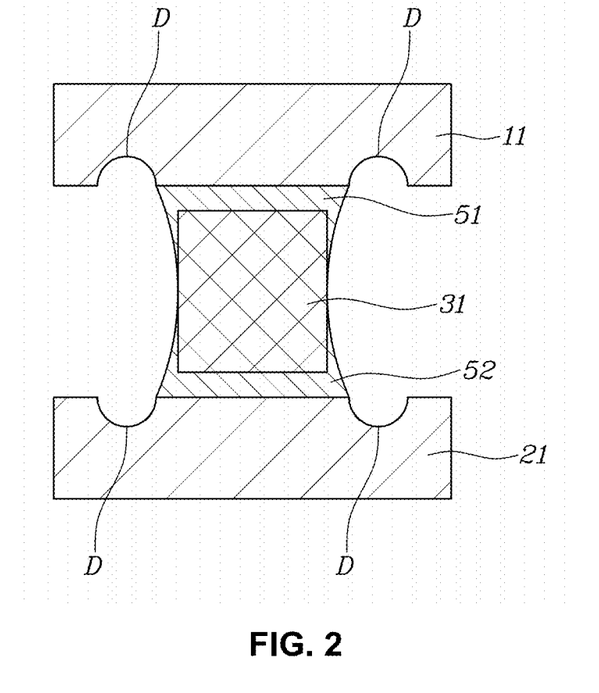
FIG. 2 is a further enlarged cross-sectional view showing the soldering structure of the exemplary embodiment shown in FIG. 1.
Figure 3:
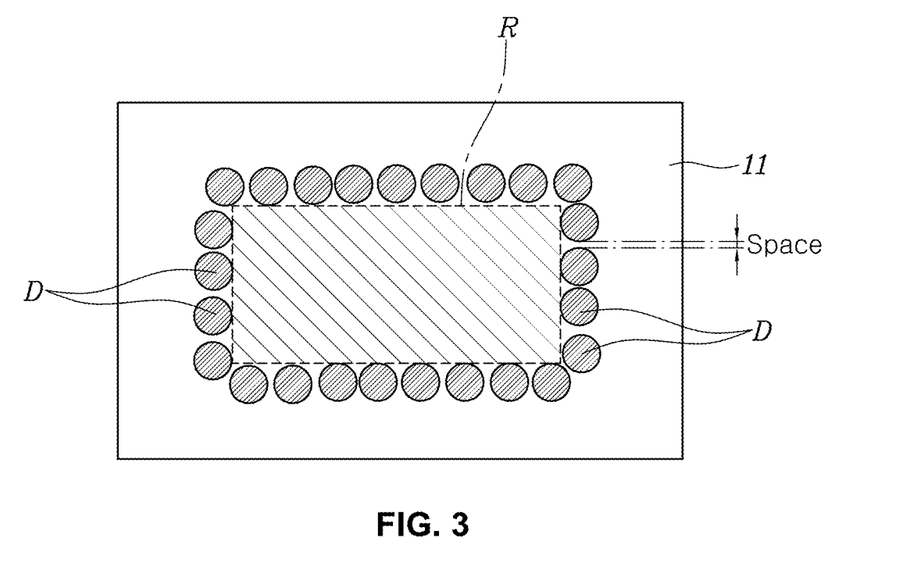
FIG. 3 is a plan view showing a surface of a metal layer of the soldering structure according to various exemplary embodiments of the present invention.

FIG. 2 is a further enlarged cross-sectional view showing the soldering structure of the exemplary embodiment shown in FIG. 1; and FIG. 3 is a plan view showing a surface of a metal layer of the soldering structure according to various exemplary embodiments of the present invention. FIG. 2 is a view showing the area marked by the 'A1' in FIG. 1; and FIG. 3 is a plan view showing that the spacer 31 or 32 and the metal layer 11 or 21 are bonded to each other in the area marked by 'A1' or 'A2' of FIG. 1.

Referring to FIG. 2 and FIG. 3, in the soldering structure according to various exemplary embodiments of the present invention, the metal layers 11 and 21 may each include: a bonding area R to which one surface of a component to be soldered, such as the spacer 31 or 32, is bonded; and the groove portion D formed around the bonding area R.

The groove portion D may block the solders in a molten state used to bond the spacers 31 and 32 and the metal layers 11 and 21 to each other, respectively, from being moved along the surfaces of the metal layers 11 and 21. Instead, the molten solders may be moved vertically along side surfaces of the spacers 31 and 32, respectively. Here, the side surfaces of the spacers 31 and 32 may refer to surfaces formed in a direction perpendicular to one surfaces of the spacers 31 and 32 facing the metal layers 11 and 21, respectively, and may refer to surfaces corresponding to the left and right of the spacers 31 and 32 shown in FIG. 1 or 2, respectively.

For the molten solders 51 and 52 not to be diffused along the surfaces of the metal layers 11 and 21 and to be moved along the side surfaces of the spacers 31 and 32 as described above, the surfaces of the spacers 31 and 32 need to have excellent solder wettability.

The solder wettability may refer to a property that the molten solder spreads over a base metal, e.g., the surfaces of the spacers 31 and 32. In various embodiments of the present invention, an a metal having excellent solder wettability needs to be employed on the surfaces of the spacers 31 and 32 to prevent the solders from being moved to the surfaces of the metal layers 11 and 21 to affect patterns of the metal layers, respectively.

To the present end, each of the spacers 31 and 32 is made of a metal having excellent solder wettability due to its low contact angle formed by the molten solder (for example, a contact angle of about 40 degrees or less), such as copper (Cu), gold (Au), silver (Ag) or nickel (Ni), or each of the spacers 31 and 32 is manufactured to have its surface plated with the above metal.

As described above, according to the various embodiments of the present invention, it is possible to prevent the molten solders from being moved along the surfaces of the metal layers 11 and 21 and allow the solders 51, 52 and 53 to be moved to the side surfaces of the spacers 31 and 32, preventing the solders from affecting patterns formed by the metal layers 11 and 21 due to the solder overflow even though the large amount of solder is used to adjust the height of the power module.

In various exemplary embodiments of the present invention, the groove portion D may have a shape in which a plurality of dimples is arranged to surround the bonding area R around the bonding area R.

The inventors of the present invention most effectively tested whether deformation occurs in a pattern of a metal layer due to the solder overflow by variously changing a shape of a groove portion. FIG. 4, FIG. 5, FIG. 6, FIG. 7 and FIG. 8 show the results of the present test.

Figure 6:
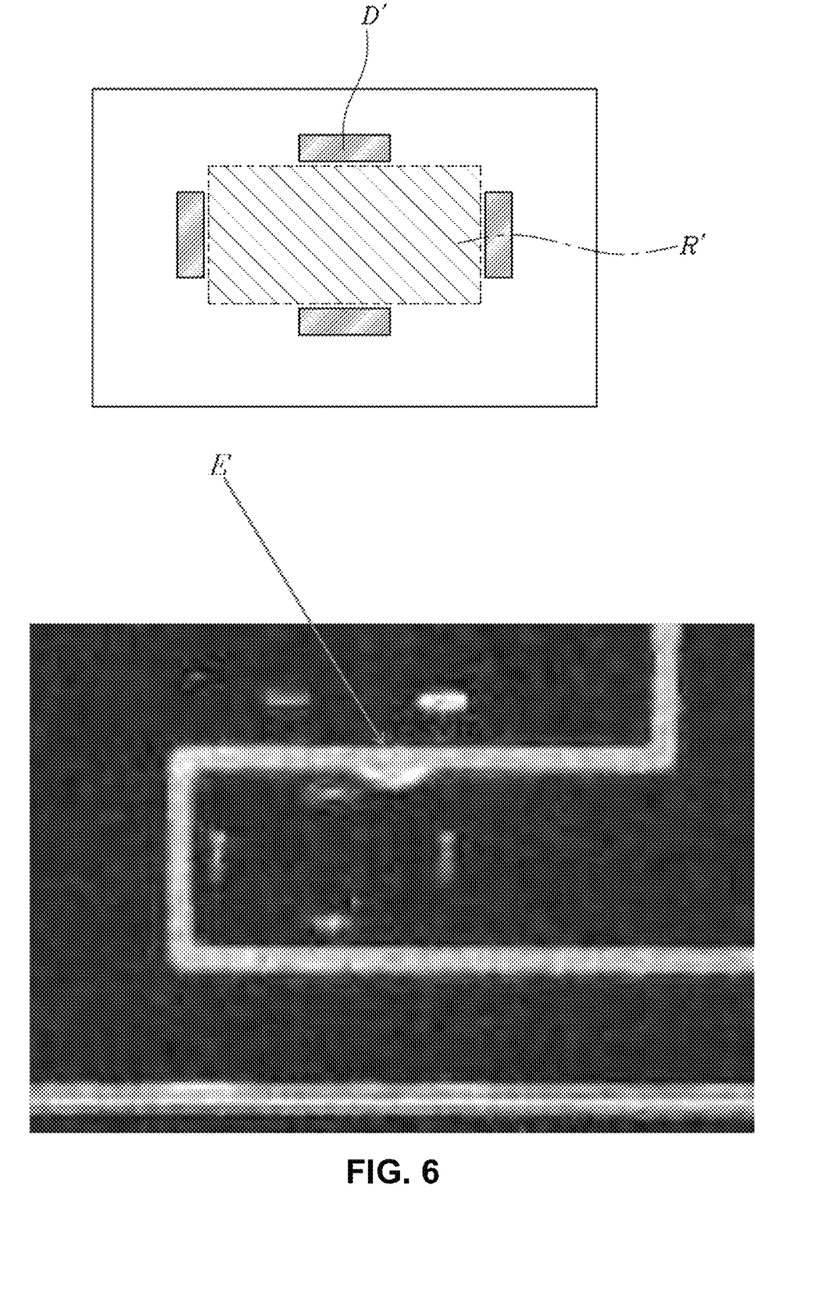
Figure 7:
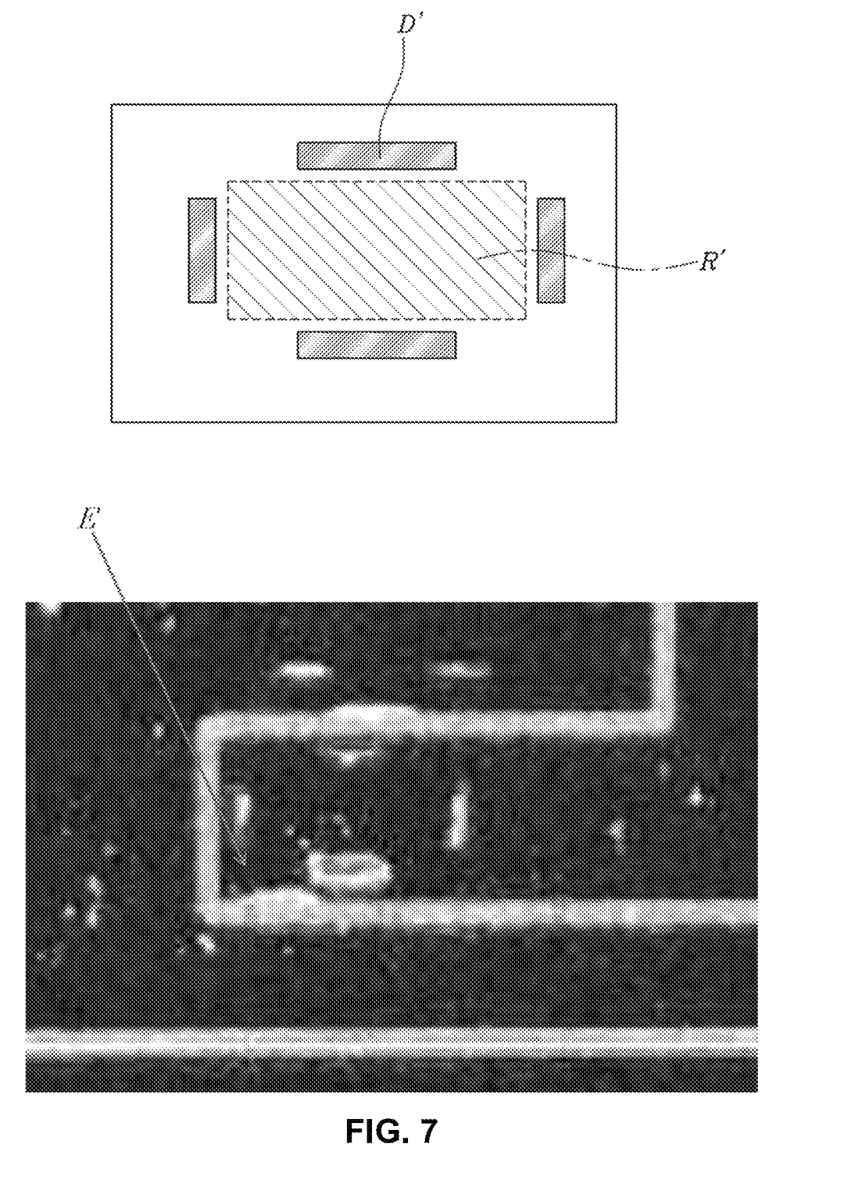
Figure 8:
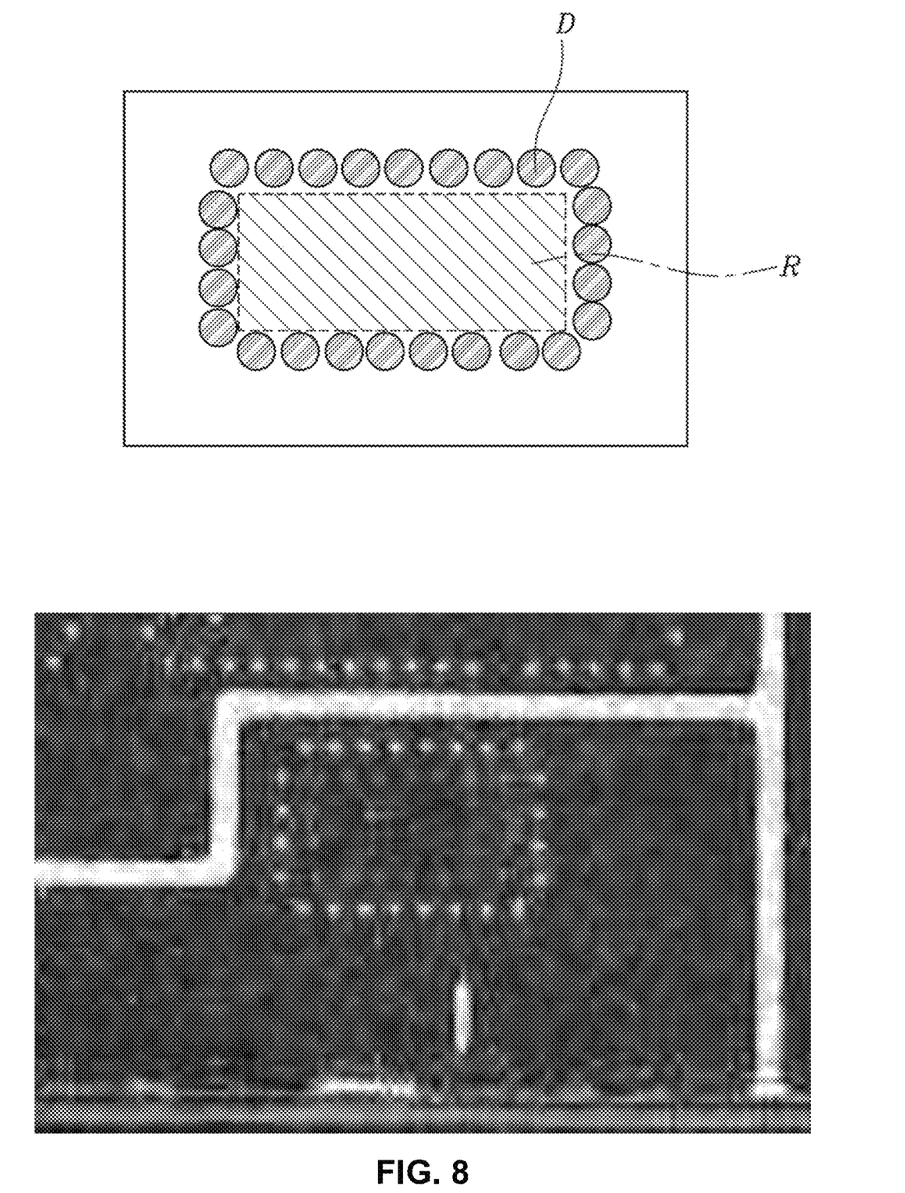
FIG. 8 is a view showing a shape of a groove portion and a pattern state of a metal layer of the soldering structure according to various exemplary embodiments of the present invention.

FIG. 4, FIG. 5, FIG. 6 and FIG. 7 are views showing various shapes of groove portions and patterns of metal layers based thereon as comparative examples of the present invention; and FIG. 8 is a view showing a shape of a groove portion and a pattern state of a metal layer of the soldering structure according to various exemplary embodiments of the present invention.

Figure 4:
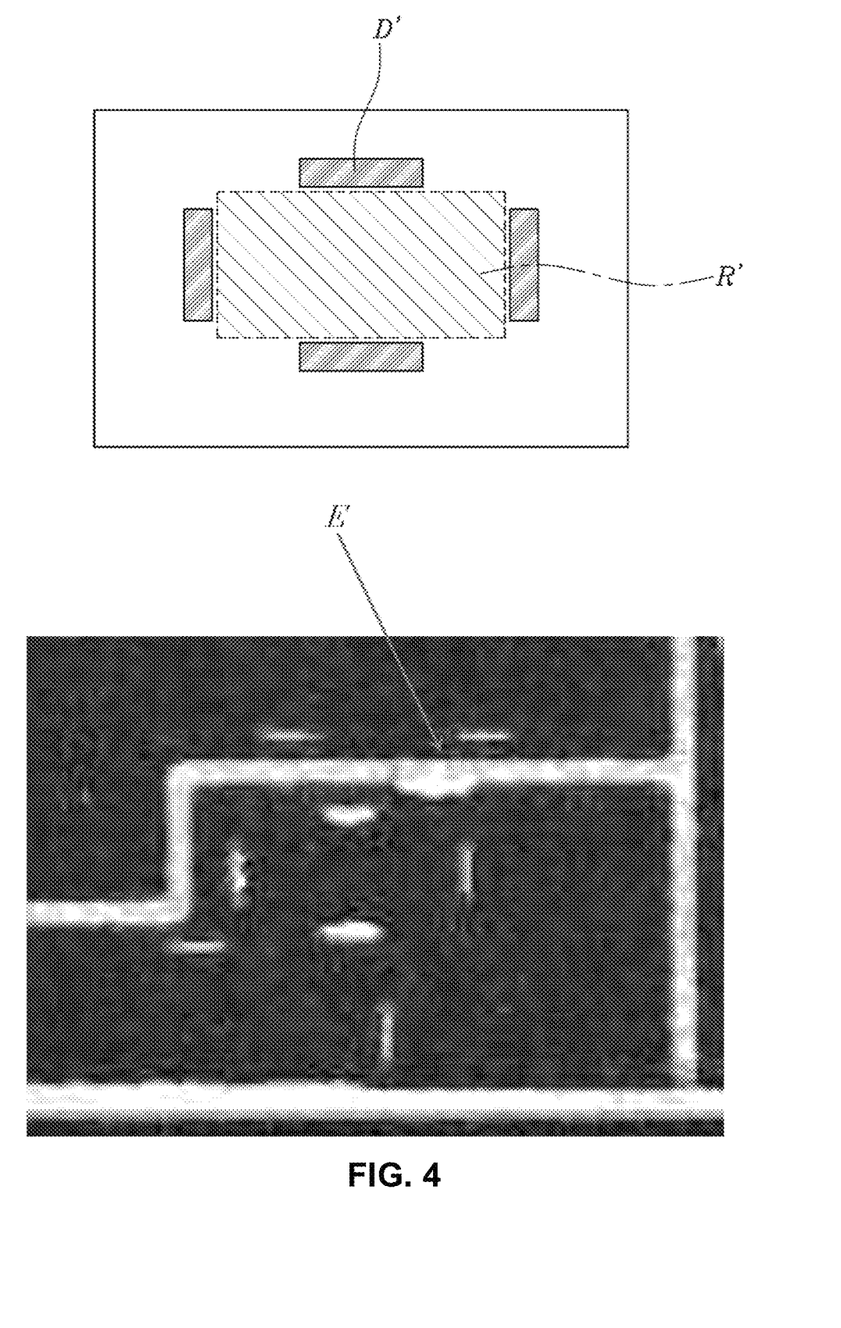
FIG. 4, FIG. 5, FIG. 6 and FIG. 7 are views showing various shapes of groove portions and patterns of metal layers based thereon as comparative examples of the present invention.
Figure 5:
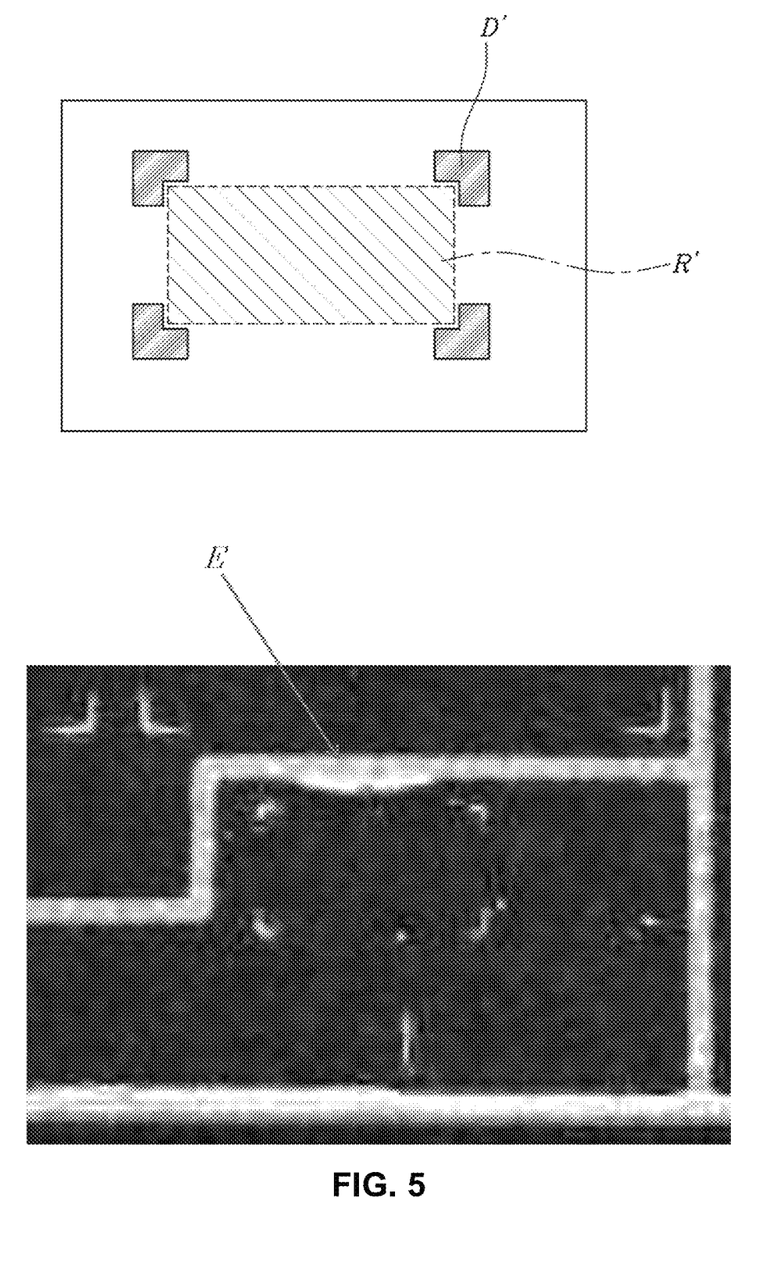

FIG. 4 shows an example in which a groove portion D' is formed in a shape of a groove disposed along a direction in which each side of a bonding area R' having a rectangular planar shape is disposed; FIG. 5 shows an example in which the groove portion D' is formed to have L-shaped grooves near respective vertices of the bonding area R' having the rectangular planar shape; FIG. 6 shows an example of reducing a space between the groove portion and the bonding area of the comparative example shown in FIG. 4; and FIG. 7 shows an example of increasing the space between the groove portion and the bonding area of the comparative example shown in FIG. 4.

As shown in photos disposed in respective lower portions of FIG. 4, FIG. 5, FIG. 6, and FIG. 7, it may be seen that in all of the comparative examples, deformation E occurs in the patterns of the metal layers due to the solder overflow. In a case where the solder causes deformation in the pattern of the metal layer as above, damage to the substrate may occur due to thermal shock.

On the other hand, it may be seen that the soldering structure according to various exemplary embodiments of the present invention shown in FIG. 8 does not affect the pattern of the metal layer.

These results are because the solder may be easily flowed into and fill each groove portion D' of the comparative examples, which is formed in a shape of a groove, and thus may not be effectively confined therein.

Furthermore, in a case where the dielectric layers 12 and 22 are exposed, such an exposure may not only change an electrical path formed by the metal layers 11 and 21 but also be disadvantageous to distribution of stress. It is thus necessary to form a groove portion by removing only some of the metal layers 11 and 21 without exposing the insulating layers 12 and 22. However, when taking into account precision of an etching process used for forming the groove-shaped groove portion D' of each of the comparative examples as shown in FIG. 4, FIG. 5, FIG. 6, and FIG. 7, it is very difficult to remove some of the metal layers 11 and 21 without exposing the insulating layers 12 and 22 of the substrates 10 and 20.

As described above, it is very advantageous to form the dimple-shaped groove portion as in various exemplary embodiments of the present invention when taking into account both the prevention of the solder overflow and the difficulty of the process.

Figure 9:
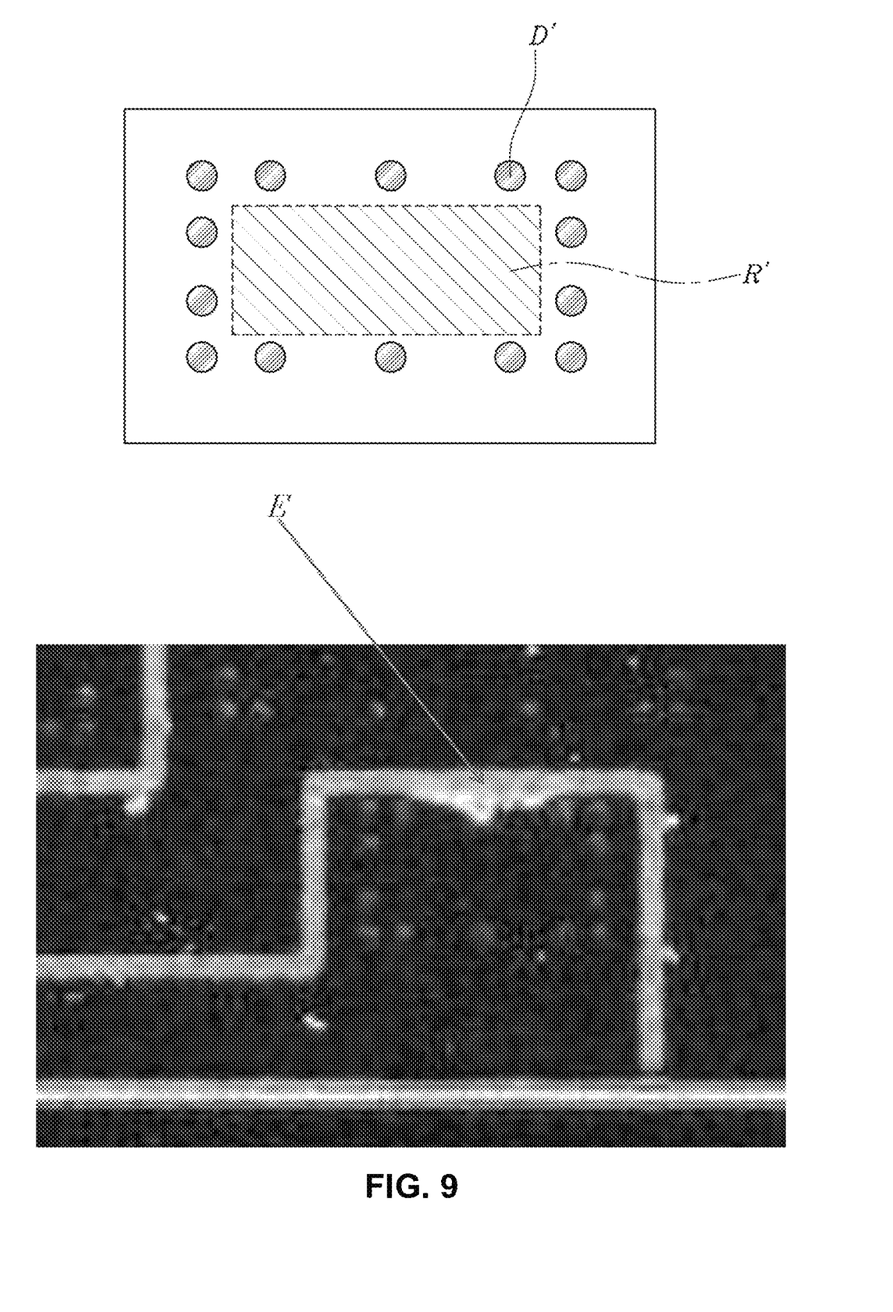
FIG. 9 is a view showing an example of increasing a space between a plurality of dimples configuring a groove portion as another comparative example of the present invention.

FIG. 9 is a view showing an example of increasing a space between a plurality of dimples configuring a groove portion as another comparative example of the present invention. As seen from the comparison between FIG. 8 and FIG. 9, in a case where the space between the dimples is large, the deformation E occurs in a pattern of a metal layer due to the solder overflow.

According to various exemplary embodiments of the present invention, it is possible to prevent the solder overflow by allowing the solder to flow upward along a side surface of the chip between the dimple D and the component to be soldered. That is, the solder confinement in various exemplary embodiments of the present invention may be achieved by confining the solder between the dimple D and the component to be soldered, rather than confining the solder in the dimple D. The solder confinement using these dimples may be achieved more easily if the space between the dimples is small, and the space between each of the plurality of dimples D may preferably be smaller than a diameter of each of the plurality of dimples. The space between each of the plurality of dimples D may more preferably be smaller than or equal to half the diameter of each of the plurality of dimples.

Furthermore, in a case where there is a limitation on the number of dimples D to be formed, the dimples D are formed mainly at the vertices of the area to be soldered. In a case where the solder is molten and compressed during the soldering, the component to be soldered may be deviated from the soldering area or rotated along a portion where the solder is wetted. However, when the dimple D is formed adjacent to the vertices of the area to be soldered, the solder may be confined near the vertices of the component to be soldered, preventing the component to be soldered from being deviated or rotated.

As described above, according to the soldering structure and the power module including the same according to the various embodiments of the present invention, it is possible to minimize the solder overflow to a boundary of the pattern formed on the metal layer of the substrate even though the large amount of solder is provided to control the height of the power module in the manufacturing process of the power module. Accordingly, it is also possible to prevent the damage to the substrate due to the thermal shock by preventing the stress from being added to the substrate due to the solder overflow.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A soldering structure comprising:
a component to be soldered; and
a metal layer having a bonding area, to which the component to be soldered is bonded by solder, and a groove portion formed on the outside of the bonding area,
wherein a surface of the component to be soldered is formed by a material with high solder wettability than a surface of the first metal layer and
wherein the groove portion is spaced outward from the component to be soldered.

2. The soldering structure of claim 1, wherein the groove portion has a plurality of dimples surrounding the bonding area.

3. The soldering structure of claim 2, wherein a space between each of the plurality of dimples is smaller than a diameter of each of the plurality of dimples.

4. The soldering structure of claim 2, wherein a space between each of the plurality of dimples is smaller than or equal to half a diameter of each of the plurality of dimples.

5. The soldering structure of claim 1, wherein the component to be soldered is made of a metal material including copper (Cu), silver (Ag), gold (Au) or nickel (Ni).

6. The soldering structure of claim 1, wherein the component to be soldered has a surface plated with a metal material including copper (Cu), silver (Ag), gold (Au) or nickel (Ni).

7. The soldering structure of claim 1, wherein the component to be soldered has one surface facing the bonding area and a side surface perpendicular to the one surface, and the solder extends to the side surface of the component to be soldered.

8. A power module comprising:
a component to be soldered; and
a first substrate including a first metal layer, a dielectric layer and a second metal layer,
wherein the first metal layer incudes an upper surface having a bonding area, to which the component to be soldered is bonded by solder, and a groove portion formed on the outside of the bonding area,
wherein the dielectric layer is bonded to a lower surface of the first metal layer,
wherein the second metal layer is bonded to a lower surface of the dielectric layer,
wherein a surface of the component to be soldered is formed by a material with higher solder wettability than a surface of the first metal layer and
wherein the groove portion is spaced outward from the component to be soldered.

9. The power module of claim 8, wherein the groove portion has a plurality of dimples surrounding the bonding area.

10. The power module of claim 9, wherein a space between each of the plurality of dimples is smaller than a diameter of each of the plurality of dimples.

11. The power module of claim 9, wherein a space between each of the plurality of dimples is smaller than or equal to half a diameter of each of the plurality of dimples.

12. The power module of claim 8, wherein the component to be soldered is a spacer electrically connecting the first metal layer and another component to each other.

13. The power module of claim 8, further including:
a second substrate including a third metal layer, a dielectric layer and a fourth metal layer,
wherein the third metal layer includes an upper surface having a bonding area, to which the component to be soldered is bonded by solder, and a groove portion formed around the bonding area,
wherein the dielectric layer is bonded to a lower surface of the third metal layer and
wherein the fourth metal layer is bonded to a lower surface of the dielectric layer, and
wherein the component to be soldered is a spacer electrically connecting the first metal layer and the third metal layer to each other.

14. The power module of claim 12, wherein the spacer includes a metal material of copper (Cu), silver (Ag), gold (Au) or nickel (Ni).

15. The power module of claim 12, wherein the spacer has a surface plated with a metal material including copper (Cu), silver (Ag), gold (Au) or nickel (Ni).

16. The power module of claim 12, wherein the spacer has one surface facing the bonding area and a side surface perpendicular to the one surface, and the solder extends to the side surface of the spacer.

17. The power module of claim 8, wherein a depth of the groove portion is smaller than a thickness of the first metal layer.

18. The power module of claim 13, wherein a depth of the groove portion is smaller than a thickness of the third metal layer.

19. The power module of claim 8, wherein a first end portion of the component to be soldered is bonded to a power semiconductor chip by a first solder and a second end portion of the component to be soldered is bonded to the first metal layer of the first substrate by a second solder, and the groove portion is formed only on the first metal layer of the first substrate.

* * * * *